United States Patent [19]

Nichols et al.

[11] 3,959,785

[45] May 25, 1976

[54] RADIATION HARDENED PLATED WIRE FOR MEMORY

[75] Inventors: Donald K. Nichols, Long Beach; Virgil H. Strahan, Orange, both of Calif.

[73] Assignee: The United States of America as represented by the Secretary of the Navy, Washington, D.C.

[22] Filed: Jan. 23, 1975

[21] Appl. No.: 543,207

[52] U.S. Cl. .................... 340/174 TF; 307/88 TF

[51] Int. Cl.² .................... G11C 11/02; H01F 27/42

[58] Field of Search .............. 340/174 TF, 174 PW, 340/174 S; 307/88 TF

[56] References Cited

UNITED STATES PATENTS

| | | | |
|---|---|---|---|
| 3,422,410 | 1/1969 | Bartik | 340/174 S |
| 3,699,549 | 10/1972 | Bryzinski | 340/174 S |
| 3,715,793 | 2/1973 | Kefalas | 340/174 PW |
| 3,844,909 | 10/1974 | McCary | 340/174 PW |
| 3,866,192 | 2/1975 | Ulmer | 340/174 TF |

*Primary Examiner*—Daryl W. Cook
*Assistant Examiner*—Robert M. Kilgore
*Attorney, Agent, or Firm*—R. Sciascia; R. Beers; S. Scheinbein

[57] ABSTRACT

A plated bit wire for a plated-wire memory comprising an extra outer plating of non-magnetic copper exterior to the outer-most, magnetic-film layer to a thickness of between 0.25 and 0.5 mils for the purpose of shielding the magnetic layer against high-frequency, transient currents induced by short radiation pulses.

7 Claims, 1 Drawing Figure

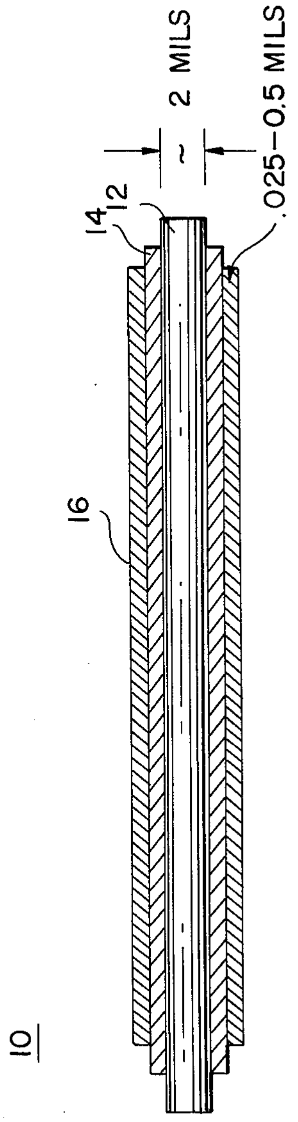
~ 2 MILS
.025–0.5 MILS
12
14
16
10

RADIATION HARDENED PLATED WIRE FOR MEMORY

FIELD OF THE INVENTION

The invention relates generally to data storage devices and in particular to plated-wire memories for use in a computer.

DESCRIPTION OF THE PRIOR ART

The ever increasing need for higher speed, high capacity magnetic memories with non-destructive readout has led to an intensive research effort in the direction of utilizing magnetic thin films of various types and, eventually, to the development of the plated wire memory element. Basically, the plated wire memory element consists of a non-magnetic wire substrate which is overlaid with a coating of magnetic material. In the process of forming the coating of magnetic material, a high magnetic anistropy is established which favors a selected orientation in a particular direction. Information is then stored according to the sense of the magnetization of the plated wire. This forms the basis for binary information storge wherein the information is stored in one of the two possible magnetization directions which are commonly referred to as the "one" and "zero" directions. Reading out of the stored information is accomplished by the use of a word strap which runs orthogonal to, and envelops the plated wire. Current in the word strap produces a magnetic field along the axis of the plated wire which, in turn, causes the magnetization vector to be displaced by some angle from its one or zero orientation, thereby causing a component of the magnetization to decrease. This change causes a voltage to appear at the ends of the plated wire where it can be sensed. In order to achieve non-destructive readout, the amplitude of the word current is so controlled that the magnetization returns to its original position when the current is turned off.

Typical plated wire consists of a non-magnetic wire substrate which is commonly of berryllium-copper or a phosphor-bronze alloy, a non-magnetic intermediate layer, normally of copper, having a controlled roughness and overlaying the wire substrate and a final zero magnetostrictive magnetic layer of a nickel-iron alloy. Prior art plated wire memory elements of the general type are illustrated and described by Richards et al. in "Topography Control of Plated Wire Memory Elements," IEEE Transactions on Magnetics, volume MAG-4, No. 3 September 1968, and also by Mathias and Fedde in "Plated Wire Technology: A Critical Review", IEEE Transactions on Magnetics, volume MAG-5, No. 4, December 1969.

From the above description of plated wire memory operation it can be seen that this type of information storage is extremely vulnerable to high-electromagentic-radiation environments which might induce transient currents in the plated wires. Such induced currents would change the sense of magnetization of the plated wire thus destroying information that it holds. This type of high, radiation environment would for example, be caused by the use of a atomic weapons where there would be substantial emissions of gamma rays and X-rays.

SUMMARY OF THE INVENTION

Briefly, the plated bit wire of the present invention obviates the problem of information destruction in a high, radiation environment by adding an extra plating of non-magnetic, highly conductive material to a thickness of 0.25 to approximately 0.5 mils. This thickness constitutes 2 to 3 times the skin-effect depth and thus confines a substantial portion of any transient, induced currents to this extra, outer plating.

OBJECTS OF THE INVENTION

An object of the present invention is to prevent the destruction of information held on a plated wire in a high radiation environment.

A further object of the present invention is to permit plated-wire memories to be used in high radiation environments.

A still further object is to confine any induced, transient currents to a non-magnetic, outer layer on a plated wire.

Other objects, advantages, and novel features of the present invention will become apparent from the following detailed description of the invention when considered in conjunction with the accompanying drawings.

A BRIEF DESCRIPTION OF THE DRAWING

The single FIGURE is a cross-sectional, side view of one embodiment of the present invention.

DETAILED DESCRIPTION OF THE INVENTION

Referring now to the drawing, there is shown by, way of example, an enlarged, side view of a typical plated-wire memory element. The memory element 10 is comprised of an electrically conductive wire 12 overlaid with a thin magntic film 14. By way of example, the conductive wire 12 may be a 2 mils diameter berryllium-copper wire. The magnetic thin film 14 might be an alloy of 81 percent nickel and 19 percent iron. This magnetic film 14 is continuous and is placed in the presence of a magnetic field that establishes a magnetic anisotropy axis (preferred or easy magnetization direction).

Around this typical, plated, bit wire 10 is overlaid an outer layer 16 of non-magnetic, highly conductive material. This outer layer 16 is exterior to the thin-film, magnetic layer 14 and provides a shield against high frequency (short pulse) transient currents induced by a radiation pulse.

It is essential that this outer layer 16 have a thickness of between 0.25 and 0.5 mils. This thickness is equivalent to two to three times the skin depth of the radiaton induced current. The exact thickness required for any particular application is dictated by the radiation environment to be shielded out and the skin depth penetration of the radiation induced current into the material used for the outer layer 16. The skin depth penetration is given by the following equation $$\delta = \sqrt{\frac{\rho}{\tau f \mu}}$$

where:

$\rho$ is the resistivity of the conductive layer 16;

$f$ is the frequency of the radiation pulse; and $\mu$ is the absolute magnetic permeability of the conductive layer 16.

Thus the thickness of layer 16 depends on the frequency of the radiation pulse, the absolute magnetic permeability of the conductive layer 16 and its resistivity. The optimum layer 16 thickness has been found to be 2 to 3 times the skin depth penetration.

Clearly a highly conductive material (low resistivity) should be used in order to reduce the thickness required to obtain the desired 2 or 3 times the $\delta$ depth. Copper and silver are two examples of highly conductive material that could be used as the outer layer 16.

The addition of this extra, conductive layer 16 will, of course, increase the power requirement to trigger the bit read-out and write-in functions. Thus the maximum thickness of the outer layer 16 is limited by the power requirements for the READ and WRITE functions.

If the layers 14 and 16 are separated at the ends of the bit wire 10 as shown in the FIGURE, the lower conductivity of the magnetic material layer 14 further assists in confining the induced, transient currents to the outer layer 16.

Since currents exterior to the magnetic layer 14 do not alter the magnetic field passing through the layer 14, devices with such an extra, outer layer 16 should be 2 to 3 times more radiation resistant than conventional, plated-wire memories.

It should be understood that the present invention is not restricted to any particular, plated-wire element. Although a wire 12 with only one layer 14 is shown in the drawing, this should not be construed to limit the invention. There may be a plurality of layers on the wire 12. For example, multiple layers of thin magnetic film could be plated on the wire 12 interspersed with non-magnetic layers. Additionally, there is no restriction on the direction that the magnetic, anisotropy axis may take.

Obviously, many modifications and variations of the present invention are possible in light of the above teachings. It is therefore to be understood that, within the scope of the appended claims, the invention may be practiced otherwise than as specifically described.

What is claimed is:

1. A plated wire for use in a plated-wire memory comprising:

a non-magnetic, wire substrate, at least one layer of magnetic, electrically conductive material overlaying said wire substrate; and an outer layer of non-magnetic, electrically conductive material to a thickness of 2 or 3 times the skin depth penetraton of radiation induced currents overlaying the outer-most layer of said wire substrate.

2. A plated wire as defined by claim 1 wherein the outer conductive material thickness is between 0.25 and 0.5 mils.

3. A plated wire as defined by claim 1 wherein said outer conductive material is copper.

4. A plated wire for use in a plated wire memory comprising:

a magnetically plated wire for the storage of information according to the sense of the magnetization of the wire; and an outer layer of non-magnetic, electrically conductive material to a thickness of 2 or 3 times the skin-depth penetration of radiation induced currents overlaying said magnetically plated wire.

5. A plated wire as defined by claim 4 wherein the outer, conductive material thickness is between 0.25 and 0.5 mils.

6. A plated wire as defined by claim 4 wherein said outer, conductive material is copper.

7. A plated wire for use in a plated wire memory comprising:

a magnetically plated wire for the storage of information according to the sense of magnetization of said wire; and an outer layer of non-magnetic, electrically conductive material to a thickness of between 0.25 and 0.5 mils overlaying said magnetically plated wire.

* * * * *